United States Patent
Mano et al.

(10) Patent No.: US 7,812,702 B2
(45) Date of Patent: Oct. 12, 2010

(54) INDUCTOR AND ELECTRIC POWER SUPPLY USING IT

(75) Inventors: Yasuhiko Mano, Ogaki (JP); Takashi Kariya, Ogaki (JP); Shinobu Kato, Ogaki (JP)

(73) Assignee: Ibiden Co., Ltd., Ogaki (JP)

( * ) Notice: Subject to any disclaimer, the term of this patent is extended or adjusted under 35 U.S.C. 154(b) by 0 days.

(21) Appl. No.: 12/466,940

(22) Filed: May 15, 2009

(65) Prior Publication Data
US 2009/0225525 A1 Sep. 10, 2009

Related U.S. Application Data

(62) Division of application No. 11/429,157, filed on May 8, 2006.

(51) Int. Cl.
*H01F 5/00* (2006.01)
(52) U.S. Cl. .................................................... 336/200
(58) Field of Classification Search ................. 336/65, 336/83, 200, 232–234; 257/531
See application file for complete search history.

(56) References Cited

U.S. PATENT DOCUMENTS

| | | | |
|---|---|---|---|
| 5,384,434 A * | 1/1995 | Mandai et al. ............... | 174/258 |
| 6,091,310 A | 7/2000 | Utsumi et al. | |
| 6,153,290 A | 11/2000 | Sunahara | |
| 6,375,823 B1 | 4/2002 | Matsuda et al. | |
| 6,462,950 B1 * | 10/2002 | Pohjonen ..................... | 361/704 |
| 6,740,411 B2 * | 5/2004 | Kojima et al. ................ | 428/413 |
| 6,930,584 B2 | 8/2005 | Edo et al. | |
| 7,388,462 B2 | 6/2008 | Ahn et al. | |
| 2006/0145805 A1 | 7/2006 | Kim et al. | |
| 2006/0291177 A1 * | 12/2006 | Choi et al. ................... | 361/780 |

FOREIGN PATENT DOCUMENTS

| | | |
|---|---|---|
| JP | 61-145887 | 7/1986 |
| JP | 1124283 | 5/1989 |
| JP | 1-312885 | 12/1989 |
| JP | 3-14284 | 1/1991 |
| JP | 5-335775 | 12/1993 |
| JP | 2000-174443 | 6/2000 |
| JP | 2000-232078 | 8/2000 |
| JP | 2003-69169 | 3/2003 |
| JP | 2003-92489 | 3/2003 |
| JP | 2004288793 A * | 10/2004 |
| JP | 2005229766 A * | 8/2005 |

* cited by examiner

*Primary Examiner*—Tuyen Nguyen
(74) *Attorney, Agent, or Firm*—Oblon, Spivak, McClelland, Maier & Neustadt, L.L.P.

(57) ABSTRACT

An inductor embedded in a printed wiring board includes a conductor extending in the thickness direction of a printed circuit board and a magnetic body that is in contact with the conductor with no gap therebetween. For example, the magnetic body is composed of ferrite having a cylindrical tubular shape. The conductor is composed of a copper film formed by plating on an inner peripheral surface of the cylindrical tubular ferrite. The inductor is inserted in the thickness direction of the printed wiring board.

13 Claims, 11 Drawing Sheets

| CONDUCTOR | | CORE | | CURRENT FOR MEASURE-MENT (A) | INDUCTANCE (H) | | INDUCTANCE RATIO |
|---|---|---|---|---|---|---|---|
| CONDUCTOR (32)LENGTH lcon.(mm) | CONDUCTOR (32)RADIUS rcore.(mm) | CORE(30) LENGTH lcon.(mm) | CORE(30) RADIUS rcore(mm) | | CORE MATERIAL FR-4 | CORE MATERIAL Ferrite | |
| 1 | 0.125 | 1 | 0.25 | 0.01 | 1.41E-09 | 5.70E-08 | 40.5 |
| 1 | 0.125 | 1 | 0.5 | 0.01 | 1.41E-09 | 1.12E-07 | 79.6 |
| 1 | 0.125 | 1 | 1 | 0.01 | 1.41E-09 | 1.74E-07 | 123.7 |
| 1 | 0.125 | 1 | 2 | 0.01 | 1.41E-09 | 2.20E-07 | 155.9 |

FIG. 9 PRIOR ART ic body of the conductor may be composed of ferrite. The magnetic body of the conductor may be composed of a composite material containing a magnetic material and a nonmagnetic material. The magnetic body of the conductor may be

INDUCTOR AND ELECTRIC POWER SUPPLY USING IT

CROSS-REFERENCE TO RELATED APPLICATIONS

This application is a divisional of and claims the benefit of priority under 35 U.S.C. §120 from U.S. Ser. No. 11/429,157, filed May 8, 2006, the entire contents are incorporated herein by references.

BACKGROUND OF THE INVENTION

1. Field of the Invention

The present invention relates to an inductor and an electronic power supply using it. More specifically, the present invention relates to an inductor used in a smoothing circuit of a power supply circuit for large scale integrated circuits (LSIs) mounted on a printed wiring board, and a power supply circuit including the same.

2. Related Art

Recently, in semiconductor devices such as an LSI used in an electronic device, the driving voltage has been decreased to a very low value, about 1 volt, in order to achieve high performance and low electric power consumption. In order to provide such an LSI load with a driving electric power, it is necessary to provide electric power obtained by rectifying an alternating current to a direct current and decreasing the voltage in several stages. For such an application, A DC-DC converter with excellent conversion efficiency is generally used. In this case, noises during output must be suppressed using a smoothing circuit.

The smoothing circuit mainly includes two types of elements, namely, inductors and capacitors for which surface-mount devices are mainly used. The mounting of such surface-mount devices on a printed wiring board requires a certain area for mounting.

According to an inductor disclosed in FIGS. 1 and 2 in Japanese Patent Laid-open Publication No. HEI 1-312885 "Circuit Board with an Inductor embedded therein", (publication Date: Dec. 18, 1989), a cylindrical ferrite body 20 is fitted in a through-hole 18, and a conductor 24 is inserted into a through-hole 22 of the cylindrical ferrite body 20.

However, microscopically, unlike an "inductor including a conductor and a magnetic body that is in contact with the conductor with no gap therebetween" described below, this structure includes an gap between the conductor and the magnetic body, and thus a high inductance cannot be obtained.

SUMMARY OF THE INVENTION

In order to reduce the size of an electronic device and to achieve high-density mounting thereof, surface-mount devices constituting the smoothing circuit are disadvantageous in that the mounting area on a printed wring board is relatively large and the cost of the devices is high.

Accordingly, it is desirable to develop devices (inductors and capacitors) whose mounting area is relatively small.

Accordingly, it is an object of the present invention to provide a novel inductor and a method of producing the same.

Furthermore, it is another object of the present invention to provide a power supply circuit including the novel inductor.

The inductor according to this invention constituting a part of a power supply circuit comprises a magnetic body having a through-hole and a conductor formed on a surface of the through-hole. The conductor of the inductor may be composed of copper. The conductor may have a substantially cylindrical shape. The conductor of the inductor also may have a substantially hollow cylindrical shape. The magnetic body of the conductor may be of a shape such that the magnetic body substantially surrounds the conductor. The magnetic body of the conductor may be composed of ferrite. The magnetic body of the conductor may be composed of a composite material containing a magnetic material and a nonmagnetic material. The magnetic body of the conductor may be composed of a composite material containing a magnetic powder and a resin. The magnetic body of the conductor may be composed of a composite material containing a carbonyl iron powder and a resin. The inductor may further comprise a dielectric material that may be of a shape such that the dielectric material substantially surrounds the magnetic body.

An inductor of this invention embedded in a printed wiring board, comprises a magnetic body that extends in the thickness direction of the board and that has a through-hole and a conductor formed on an inner surface of the through-hole. The conductor of the inductor may be composed of copper. The conductor of the inductor may a substantially cylindrical shape. The conductor of the inductor may have a substantially hollow cylindrical shape. The magnetic body of the inductor may surround the side face of the conductor. The magnetic body of the inductor may be composed of ferrite. The magnetic body of the inductor may be composed of a composite material containing a magnetic material and a nonmagnetic material. The magnetic body of the inductor may be composed of a composite material containing a magnetic powder and a resin. The magnetic body of the inductor may be composed of a composite material containing a carbonyl iron powder and a resin. The inductor embedded in the board may further comprise a dielectric material that may surround the side face of the magnetic body. The dielectric material of the inductor may be composed of an under-fill resin material having low thermal expansion characteristics.

An electronic device of this invention comprises a board and a power supply circuit mounted on the board that supplies a semiconductor device with power; wherein the power supply circuit includes at least an inductor formed in the thickness direction of the board. The power supply circuit of the electronic device may include a thin-film capacitor formed in the direction parallel to one principal surface of the board; an inductor formed in the thickness direction of the board and a power supply IC device mounted on another principal surface of the board. Further, the power supply circuit of the electronic device may include a thin-film capacitor formed in the direction parallel to one principal surface of the board; an inductor formed in the thickness direction of the substrate and a power supply IC device mounted on another principal surface of the board; the thin-film capacitor, the inductor embedded in the board, and the power supply IC device are disposed close to the semiconductor device to connect between the power supply circuit and the semiconductor device with a short conductive circuit. The inductor of the electronic device may include a magnetic body that extends in the thickness direction of the board and that has a through-hole, and a conductor formed on the surface of the through-hole. A plurality of sets of the power supply circuits of the electronic device may be provided in the board.

A method of producing an inductor of this invention comprises the steps of providing a magnetic body extending along a longitudinal axis, forming a though-hole in the axial direction of the magnetic body, and performing plating with a metal on an inner surface of the though-hole to stick the metal on the magnetic body. The metal plating of the method for producing an inductor may be copper plating. The magnetic body of the method for producing an inductor may be composed of ferrite. The magnetic body of the method for producing an inductor may be composed of a composite material containing a magnetic material and a nonmagnetic material.

A method of embedding an inductor in a board of this invention comprises the steps of preparing an inductor that is made by preparing a longitudinally extending magnetic body and by performing metal plating on the inner surface of a through-hole formed in the axial direction of the magnetic body; forming a through-hole through the board; inserting the inductor into the through-hole; and filling a space between the inductor and the board with a resin to fix the inductor to the substrate. The method of embedding an inductor in a board may further comprise the step of filling the through-hole of the inductor with a resin. In the method of embedding an inductor in a board, both ends of the through-hole of the inductor may be covered with a metal. The method of embedding an inductor in a board may further comprise the steps of, after the inductor is fixed to the substrate, performing plating with copper on the surfaces of the board and on the inner surface of the through-hole of the inductor and patterning it.

Also, a method of embedding an inductor in a board of this invention, comprises the steps of preparing a cylindrical magnetic body, forming a through-hole through the board, inserting the magnetic body into the through-hole, filling a space between the inductor and the board with a resin to fix the inductor to the board, performing plating with copper on the surface of the board and on the inner surface of the through-hole of the magnetic body and patterning it. The method of embedding an inductor in a board may further comprise the step of filling up the through-hole of the inductor with a resin.

According to the present invention, a novel inductor and a method of producing the same can be provided.

Further, according to the present invention, a power supply circuit including the novel inductor can be provided.

DESCRIPTION OF THE PREFERRED EMBODIMENTS

The embodiments of an inductor according to the present invention and a power supply circuit including the same will now be described in detail with reference to the accompanying drawings. It should be understood that these embodiments are illustrative and do not limit the scope of the present invention. In the figures, the same reference numeral is assigned to the same element, and the repeated description of this element is omitted.

[An Electronic Device on which a Power Supply Circuit is Mounted]

(Structure)

Figure 1:
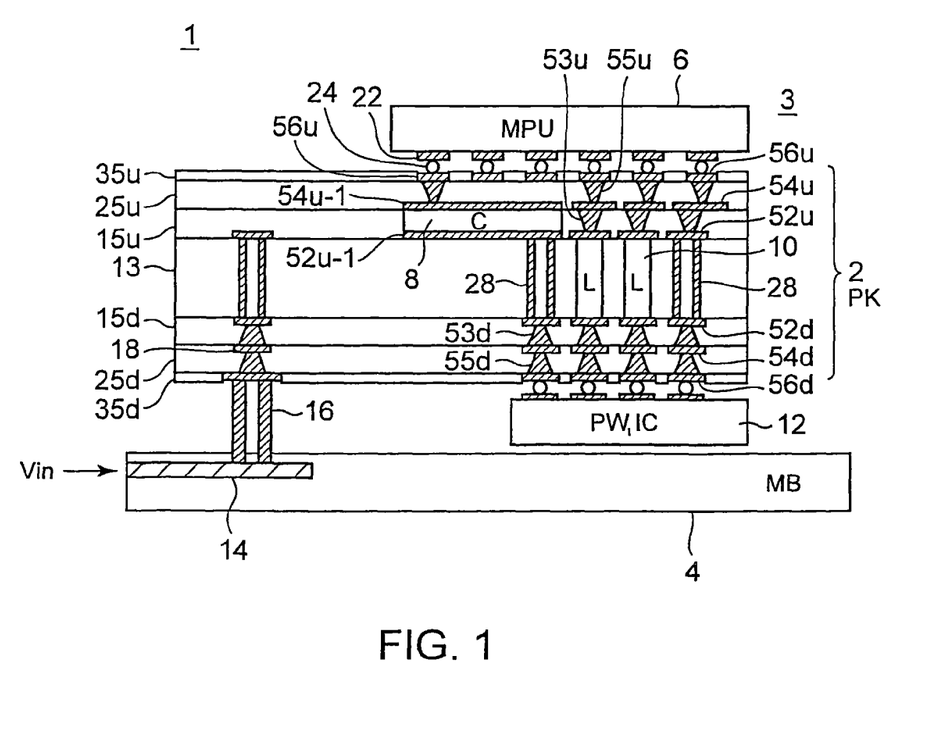
FIG. 1 is a cross-sectional view showing the structure of a printed circuit board, constituting an electronic device, on which a power supply circuit is mounted.

FIG. 1 is a cross-sectional view showing the structure of an electronic device 1 made by a printed circuit board equipped with a power supply circuit. The electronic device 1 includes a package (PK) 2 and a motherboard (MB) 4 mounted the package 2 thereon, and the both are electrically connected to each other with, for example, a pin junction 16. The motherboard 4 is composed of a suitable printed circuit board; and a DC voltage $V_{in}$ having an appropriate magnitude is supplied from the outside to a conductor circuit 14 of the motherboard 4 to send the voltage $V_{in}$ to the package 2 through the pin junction 16.

The package 2 is composed of a suitable printed circuit board, and, for example, the package 2 includes a core substrate 13, lower insulating layers 15u and 15d provided on the top and bottom surfaces of the core substrate 13, respectively, upper insulating layers 25u and 25d provided on the surfaces of the lower insulating layers 15u and 15d, respectively, and, if required, solder resist layers 35u and 35d covered on the surfaces of the upper insulating layers 25u and 25d, respectively. Conductor circuits 52u and 52d are formed on the top and bottom surfaces of the core substrate 13, respectively, and a through-hole conductor 28 is formed to connect the conductor circuits 52u and 52d. Conductor circuits 54u and 54d are formed on the lower insulating layers 15u and 15d, respectively, and via-hole conductors 53u and 53d are formed in the lower insulating layers 15u and 15d, respectively. Similarly, conductor circuits 56u and 56d are formed on the upper insulating layers 25u and 25d, respectively, and via-hole conductors 55u and 55d are formed in the upper insulating layers 25u and 25d, respectively. Preferably, the core substrate 13 is formed by a plated through-hole manufacturing process, and the lower insulating layers 15u, 15d and the upper insulating layers 25u, 25d are formed by a build-up manufacturing process.

The package 2 further includes inductors (L) 10 embedded in the board and a thin-film capacitor (C) 8 formed with conductor circuits 52u-1 and 54u-1. Furthermore, a semiconductor device (microprocessor unit (MPU)) 6 is mounted on the top surface of the package 2, and a power supply IC (PW IC) 12 is mounted on the reverse face of the package 2 preferably at the position corresponding to MPU 6 mounting position.

The thin-film type capacitor (C) 8 is formed by interposing a dielectric material 8 between the core substrate conductor circuit 52u-1 and the lower-layer conductor circuit 54u-1, and is preferably provided in the vicinity of the MPU 6. The inductors (L) 10 embedded in the board and the power supply IC (PW IC) 12 are described in detail below.

A circuit including all or any one of the thin-film capacitor (C) 8, the inductors (L) 10 embedded in the board, and the power supply IC (PW IC) 12 constitutes the power supply circuit for supplying the MPU 6 with power. The power is supplied from the power supply circuit to the MPU 6 through the conductor circuits (including the through-hole conductors and the via-hole conductors; hereinafter the same) formed in the package 2. In this electronic device 1, the distance from the output of the power supply circuit to the MPU 6, which is a load, is very short, for example, 1 mm or less. Since the length of the conductor circuit used for supplying the power is very short, voltage variations due to a parasitic resistance or a parasitic inductance of conductor circuit wiring can be suppressed.

The inductors (L) 10 embedded in the board are formed in a part of the core substrate 13 of the package 2. Alternatively, the inductors (L) 10 may be formed in a part of or throughout the entire package 2. However, in the description below, for simplicity, the case where the inductors (L) 10 embedded in a part of the core substrate 13 is described as an example.

Furthermore, the power supply to the package 2 is not limited to a set of power supply circuit (i.e., a set of the thin-film capacitor 8, the inductor 10 embedded in the board, and the power supply IC 12). When the power demand for the MPU 6 etc. is high, plural sets of the power supply circuits may be prepared and connected in parallel with each other so that each power supply circuit shares the power demand. In this case, the number of the thin-film capacitors 8, the inductors 10 embedded in the board, and the power supply ICs (PW ICs) 12 are determined according to the desired number of sets.

(Circuit and Operation)

Figure 2:
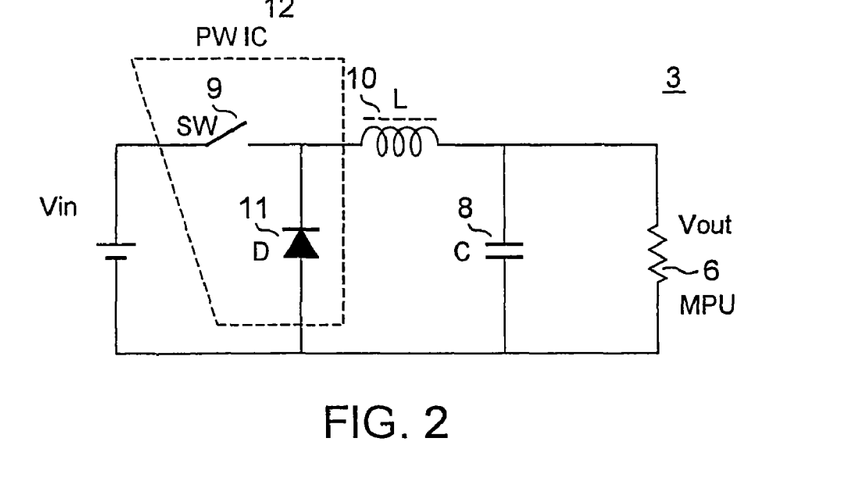
FIG. 2 is a circuit diagram showing the fundamental structure of the power supply circuit used in the electronic device shown in FIG. 1.

FIG. 2 is a circuit diagram showing the fundamental structure of a power supply circuit 3 embodied in the electronic device shown in FIG. 1. This power supply circuit 3 is a DC-DC converter that steps down the input DC voltage. In this DC-DC converter, a power supply IC (PW IC) 12, an inductor (L) 10 embedded in a board, and an MPU 6, which is a load, are connected to an input power $V_{in}$ in series; furthermore, a thin-film capacitor (C) 8 is connected across the load MPU 6 in parallel. The power supply IC (PW IC) 12 includes a switching element (SW) 9 and a diode (D) 11, and the diode 11 is connected to the load MPU 6 in parallel to function as a flywheel diode. As a power supply for the load MPU 6, the frequency of the switching element (SW) 9 is about 0.1 to 10 MHz.

This DC-DC converter serves as a DC chopper circuit in the pre-stage to change the average of the load voltage by changing the ratio of one cycle T to ON time $t_{on}$ in the input voltage $V_{in}$ with the power supply IC (PW IC) 12; and in the post-stage smoothen the output voltage changed in the pre-stage. The voltage generated at both ends of the load is referred to as $V_{out}$.

According to the fundamental operation of the DC-DC converter shown in FIG. 2, when the power supply IC (PW IC) 12 turns ON, current flows in the inductor (L) 10, which is a choke coil, the thin-film capacitor (C) 8, and the load MPU 6. At that time, electromagnetic energy is accumulated in the inductor (L) 10 and the thin-film capacitor (C) 8. Then, when the power supply IC (PW IC) 12 turns OFF, the electromagnetic energy accumulated in the thin-film capacitor (C) 8 permits the current to continue to flow to the load MPU 6. Similarly, the electromagnetic energy accumulated in the inductor (L) 10 continues to flow through the diode (D) 11, which is a flywheel diode. When the power supply IC (PW IC) 12 turns ON again, after the reverse recovery time of the diode (D) 11 has elapsed, current flows in the inductor (L) 10, the thin-film capacitor (C) 8, and the load MPU 6, and electromagnetic energy is again accumulated in the inductor (L) 10 and the thin-film capacitor (C) 8.

In this series of operations, the voltage $V_{out}$ applied to the load MPU 6 includes a ripple component, and the variations of the ripple current and voltage are determined according to the magnitude of the reactance of the inductor (L) 10 and the thin-film capacitor (C) 8. Regarding the ripple component (current variation ΔIL), a design specification value is determined in advance, and the ripple component is suppressed by a smoothing circuit (i.e., a filter circuit composed of the inductor (L) 10 and the thin-film capacitor (C) 8) to reduce the ripple component below the specified value. That is, even if the input voltage $V_{in}$ has an interrupted waveform, the direct current flows in the diode D 11, thereby providing a continuous waveform having the reduced ripple current. Furthermore, as the inductance of the inductor (L) 10 is increased, the direct current can be further smoothened.

On the other hand, this power supply circuit is used for the MPU 6 whose driving voltage is about 1 volt and the voltage drop due to resistance must be prevented as much as possible at such a low voltage. Therefore, the inductor (L) 10 must have a low resistance, a high inductance, and a small size for the purpose of reducing the size of the electronic device and realizing a high-density mounting.

Figure 3A:
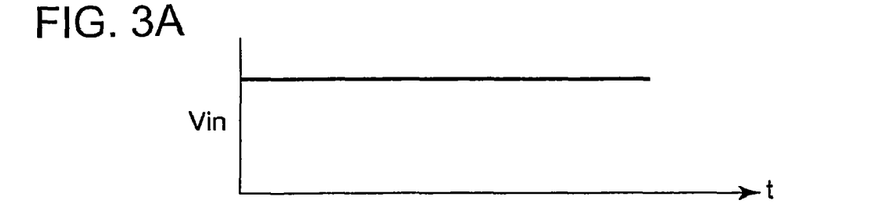
FIGS. 3A to 3D are waveform charts of the voltage or the current illustrating the operation of the power supply circuit shown in FIG. 2, wherein the abscissa of each chart is a time base t.
Figure 3B:
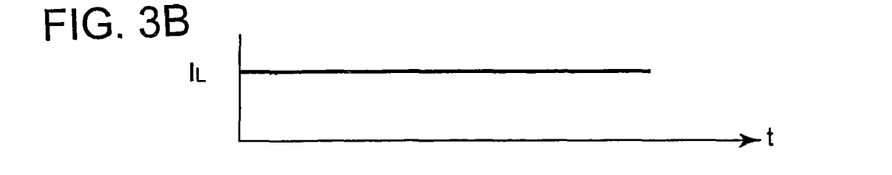

FIGS. 3A to 3D are waveform charts of the voltage or the current illustrating the above operations. The abscissa of each chart is a time base t. FIG. 3A shows an input DC voltage $V_{in}$ in the case where the switching element (SW) 9 is in the ON state, and FIG. 3B shows a current IL that flows in the inductor (L) 10 in that case. The input DC voltage $V_{in}$ and the direct current IL are constant as long as the switching element (SW) 9 is in the ON state.

Figure 3C:
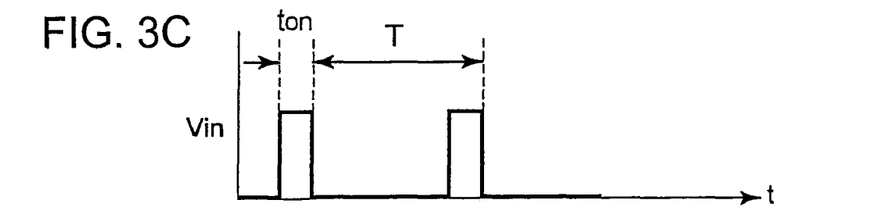

As shown in FIG. 3C, when the switching element (SW) 9 turns ON for the period of time $t_{on}$ with a cycle T, the output voltage caused by the input voltage $V_{in}$ results in rectangular waves in which the input voltage $V_{in}$ is off and on. In this case, the average voltage of the input voltage is small, $V_{out} = (t_{on}/T) * V_{in}$.

Figure 3D:
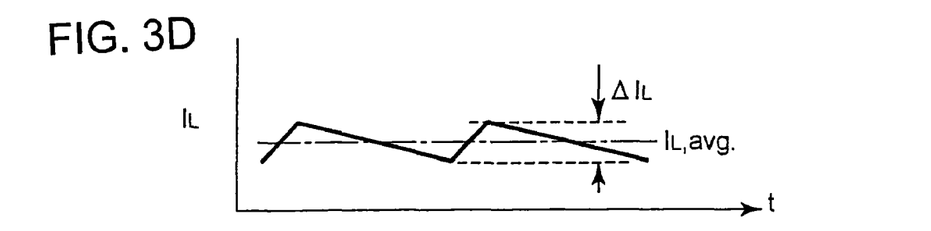

Because of the presence of the inductor (L) 10 and the thin-film capacitor (C) 8, a voltage that is continuous, but includes a ripple component, is applied to the load MPU 6. FIG. 3D shows a current that flows in the inductor (L) 10. This current has an average of IL, avg. and a ripple current of ΔIL.

[Inductor]

(Structure)

Figure 4A:
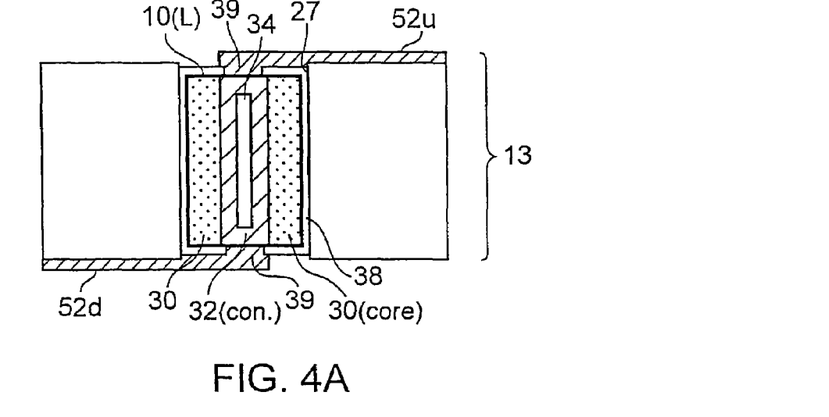
FIG. 4A is a cross-sectional view showing a state in which an inductor according to an embodiment of the present invention is embedded in a package.

FIG. 4A is a cross-sectional view showing a state in which an inductor 10 is embedded in the package 2. The inductor (L) 10 preferably has a low resistance, a high inductance, and a small size. However, in general, when the length of a conductor is increased, the inductance is increased and the resistance is also increased. On the other hand, when a magnetic material is disposed in the vicinity of the conductor, the inductance is increased.

Therefore, the present inventors decided that the resistance is reduced by using metallic copper as the conductor for the inductor and decreasing the length of the conductor. In addition, the inductance is increased by disposing a magnetic material in the vicinity of the conductor. From this point of view, the inventors propose inductors 10 embedded in a board shown in FIGS. 4A to 4C, as embodiments. Although the following description relates to the case where the inductor 10 is formed in a part of the core substrate 13, the inductor 10 may be formed in any part of or through the entire of package 2.

An embedded inductor (L) 10 shown in FIG. 4A includes a conductor (con.) 32 composed of through-hole copper and a core 30 composed of a cylindrical ferrite body surrounding the conductor 32. The inside of the through-hole copper forms a hollow part 34. The hollow part 34 provided in the conductor 32 releases a stress caused by a difference in the thermal expansion between the conductor 32 and the core 30.

The inductor 10 is disposed in a through-hole 27 provided in the core substrate 13, and the periphery of the inductor 10 is covered with a resin 38. Via conductors 39 are formed so that the openings of both end faces of the inductor 10 are covered, and the via conductors 39 are connected to the conductor layers 52$u$ and 52$d$.

Figure 4B:
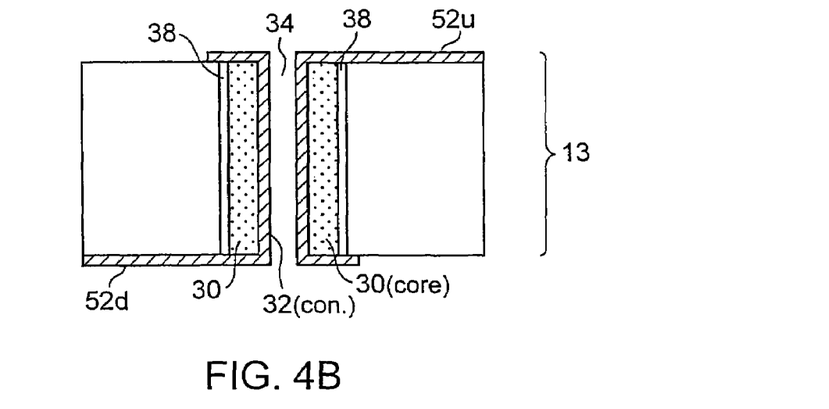
FIG. 4B is a cross-sectional view showing a state in which an inductor according to another embodiment of the present invention is embedded in a package.

FIG. 4B shows another embodiment of an embedded inductor (L) 10, where a through-hole conductor 32 is electrically connected to conductor circuits (i.e., a wiring patterns formed on the surfaces of the core substrate, a substantially sheet-shaped conductor circuits constituting a power supply layer and/or a ground layer, or a through-hole lands for electrically connecting a via-hole conductor to the upper layer). This through-hole land is not subjected to rewiring on a surface of the core substrate 13.

Figure 4C:
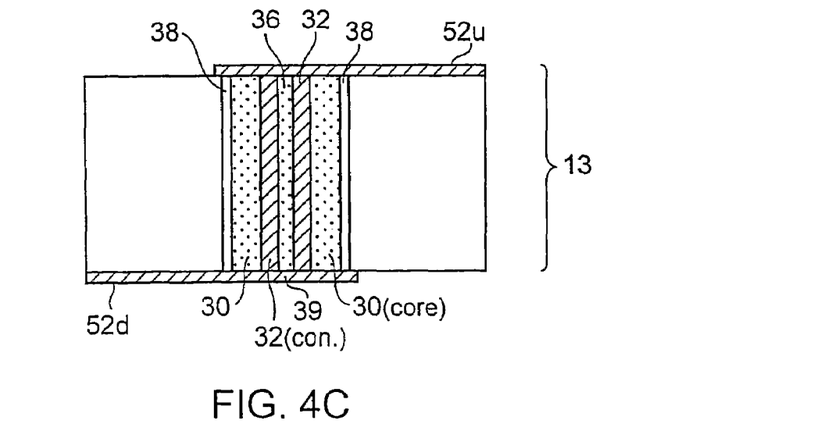
FIG. 4C is a cross-sectional view showing a state in which an inductor according to another embodiment of the present invention is embedded in a package.

Referring to FIG. 4C, a filling agent 36 is filled in the through-hole conductor 32 shown in FIG. 4B, and lid-like conductors 39 covering the filling agent 36 are provided. A via-hole conductor may be formed on the lid-like conductors 39. A material having a low elasticity is preferably used for the filling agent 36 because a stress caused by a difference in the thermal expansion between the magnetic body, the though-hole conductor, and the core substrate can be reduced.

(Performance)

Figure 5A:
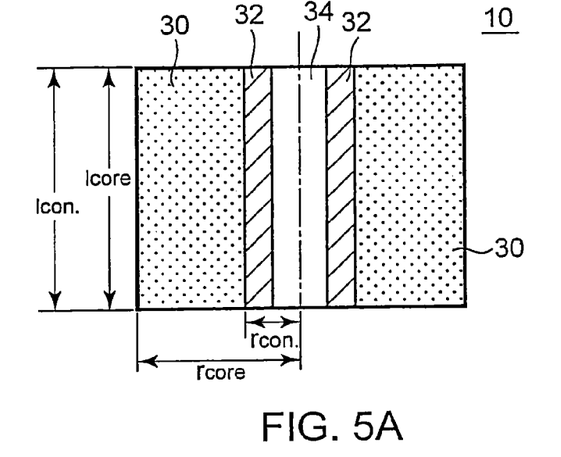
FIG. 5A is a view specifying the dimensions of the inductors shown in FIGS. 4A to 4C.
Figure 5B:
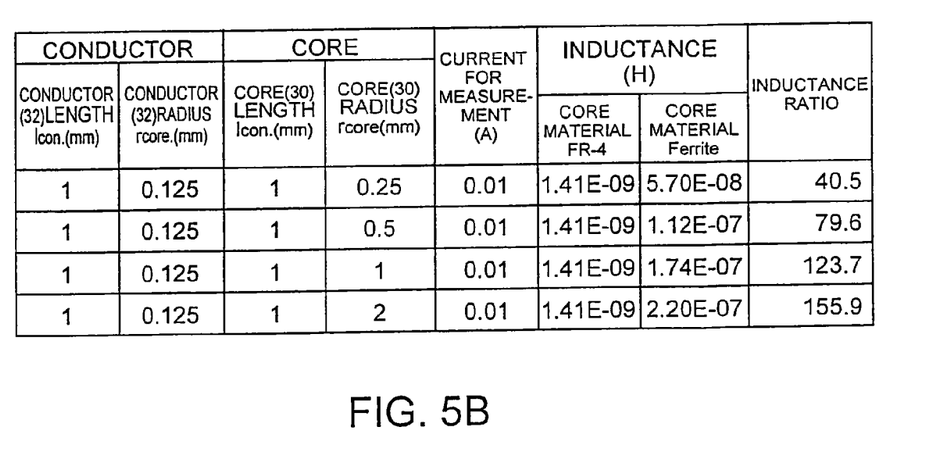
FIG. 5B is a table showing a comparison between the inductances of inductors having a ferrite core and those of inductors having a FR-4 core.
Figure 5C:
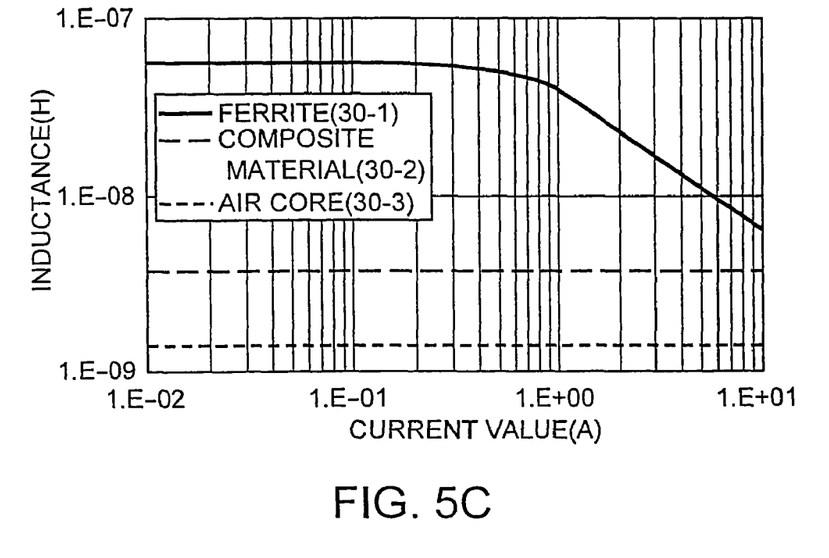
FIG. 5C is a graph showing a comparison of the inductances when the current is increased from 0.01 to 10 A.
Figure 5D:
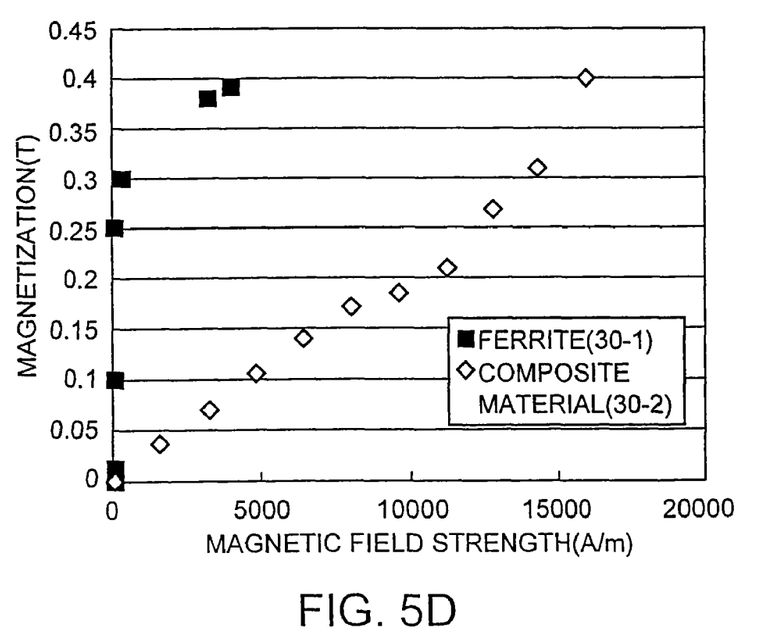
FIG. 5D is a B-T characteristic diagram showing a comparison between the inductances of an inductor having a composite material core and those of an inductor having a ferrite core.

FIGS. 5B to 5D show the performance of inductors 10 having a ferrite core shown in FIG. 5A. First, the case was examined that the thickness of the ferrite core is varied. In this experiment, inductors having a core composed of an organic material (FR-4) (relative permeability=1) were used as comparative examples.

FIG. 5A is a view specifying the dimensions of the inductors (L) 10 shown in FIGS. 4A to 4C. As shown in FIG. 5B, in the inductor samples used in this experiment, the length of the conductor 32 and the length of the core 30 are the same, i.e., $l_{con.}=l_{core}=1$ mm. The radius of the conductor 32 is also the same, $r_{con.}=1$ mm. Under these conditions, the core radius $r_{core}$ was varied from 0.25 to 2 mm to determine the variation in the inductance. The inductors of the comparative examples that have the core composed of the organic material (FR-4) also have the same dimensions.

The inductances of the inductors 10 having the ferrite core were determined as follows: When the core radius $r_{core}$ was 0.25 mm, the inductance was $5.70\times10^{-8}$H. When the core radius $r_{core}$ was 0.50 mm, the inductance was $1.12\times10^{-7}$H. When the core radius $r_{core}$ was 1 mm, the inductance was $1.74\times10^{-7}$H. When the core radius $r_{core}$ was 2 mm, the inductance was $2.20\times10^{-7}$H. As these results, it was found that the inductance is dependent on the thickness of the ferrite core. When these inductances are compared with those of the inductors having the core composed of the organic material FR-4, the inductance ratios are 40.5, 79.6, 123.7, and 155.9. Since the conductor is in contact with the magnetic body without a gap therebetween, such high inductances can be achieved.

Next, other types of magnetic material were examined instead of the ferrite magnetic material of the inductor shown in FIG. 5A. Here, a composite material containing a magnetic material and a nonmagnetic material was proposed. In the experiment, an inductor having the composite material core, that contained a carbonyl iron powder serving as the magnetic material and a resin serving as the nonmagnetic material, was prepared and was compared with the inductor having the ferrite core shown in FIG. 5A. Both inductors had a core radius $r_{core}$ of 0.25 mm.

FIG. 5C is a graph showing a comparison of the inductances of the above inductors when the current was increased from 0.01 to 10 A. An inductor 30-3 that does not include a core is shown as a comparative example. That is, the inductor 30-3 includes an air core (relative magnetic permeability=1) instead of the core composed of the FR-4 material (insulating material). In the inductor 30-1 having the ferrite core, the inductance is high in the current range of 0.01 to 0.1 A. When the current was increased in the range of 1 to 10 A, the inductance is saturated and gradually decreased. As shown in FIG. 5B, when the current for measurement was 0.01 A and the core radius $r_{core}$ was 0.25 mm, the inductance was $5.70\times10^{-8}$H. This inductance corresponds to the inductance value at the left end (at the current of 0.01 A) of the curve 30-1 in FIG. 5C.

On the other hand, the inductance of the inductor 30-2 having the composite material core is lower than that of the inductor 30-1 having the ferrite core, however the inductance of the inductor 30-2 was about three times in comparison with that of the inductor 30-3 having the air core. Furthermore, the inductor 30-2 had a feature that even when the current was further increased, the inductor 30-2 is maintained a specific inductance.

FIG. 5D is a B-T characteristic diagram showing a comparison of the inductor 30-2 having the composite material core with the inductor 30-1 having the ferrite core. When the magnetic field strength is increased from 0 to 20,000 A/m, the inductor 30-1 having the ferrite core 3 was rapidly magnetized because of its high relative permeability, but immediately reached magnetic saturation. In contrast, the inductor 30-2 having the composite material core was magnetized substantially in proportion to the magnetic field strength without causing magnetic saturation because of a relatively low relative permeability. It is believed that this property is the cause of the phenomenon shown in FIG. 5C; wherein the inductor 30-1 having the ferrite core has a high inductance, but the inductance is saturated and gradually decreased as the current increases. In contrast, the inductor 30-2 having the composite material core has a relatively low inductance, but it maintains a certain inductance.

Since the inductor 10 of this embodiment is used in a power supply circuit, a large amount of current may flow therein. When the current value is relatively low, the inductor 30-1 having the ferrite core, which has a high inductance, is preferred. On the other hand, when the current value is relatively high (for example, 0.1 A or higher, or 1 A or higher), the inductor 30-2 having the composite material core, which has a relatively low inductance but maintains a certain inductance even when the current is increased, is preferred. The final goal for the present inventors is to develop an inductor that has a high inductance and that can maintain a certain inductance even when the current is increased.

The inductor of this embodiment can be used as an inductor constituting a part of a power supply circuit that controls high current in a high frequency area (for example, in a switching power supply circuit, in order to transform the AC power to the DC power, or in order to shield a high-frequency component from a direct current or a low-frequency alternating current).

(Method of Producing an Inductor)

Figure 6:
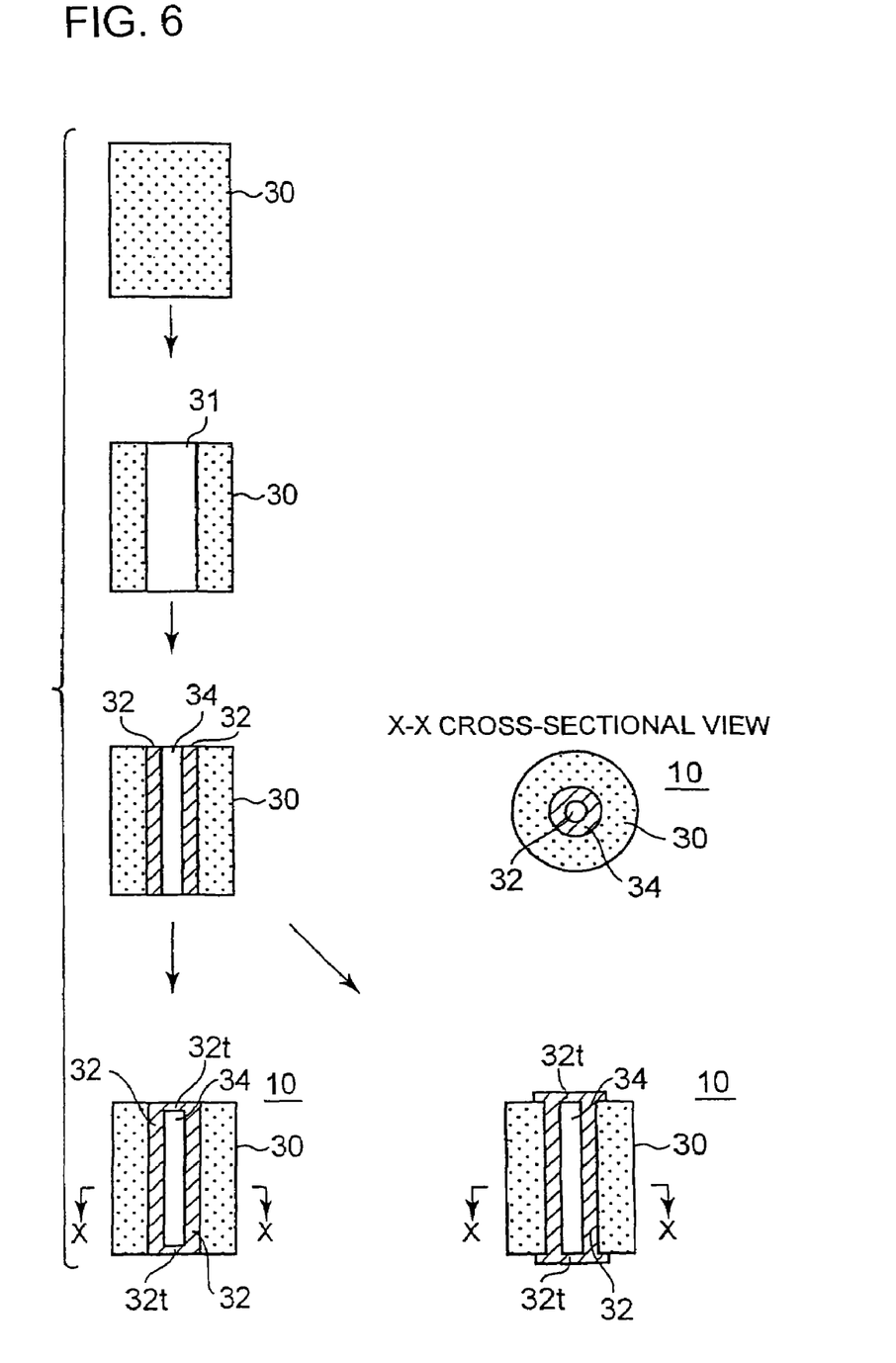
FIG. 6 includes views showing a method of producing an inductor.

FIG. 6 includes views showing a method of producing an inductor using ferrite as the core material. When a composite material is used as the core material, the method of producing the inductor is similar to the following method.

A ferrite bulk material 30, which is a magnetic material, is prepared (step 1).

Subsequently, the ferrite 30 is formed into a cylindrical shape having a through-hole 31 and is sintered (step 2). The dimensions are preferably controlled so that the sintered cylindrical ferrite 30 has a height of 0.05 to 1.00 mm. The conditions for forming and sintering the ferrite material are determined so that the sintered ferrite has a relative density of at least 95%, and preferably, at least 98%. In this case, the ferrite 30 has a relative permeability of 100 to 150 and a saturation magnetization of about 0.4 T (Tesla). Thus, the core part 30 is formed. Alternatively, this core part 30 may be formed by forming ferrite into a cylindrical shape, sintering the formed ferrite, and then opening a hole along the longitudinal axis with a suitable tool such as a drill.

Subsequently, except for the through-hole 34, both end faces of the cylindrical ferrite 30 are covered with a resist film. A thin copper film is then formed on the surface of the ferrite (i.e., on the inner peripheral surface of the through-hole 31) by chemical copper plating (i.e., electroless copper plating). Subsequently, a copper film having a thickness of about 20 µm is formed by copper pyrophosphate plating (i.e., electrolytic copper plating) to form a conductor 32 (step 3). By forming the conductor 32 on the core part 30 by plating, the conductor 32 is in contact with the core part 30 without a gap therebetween. The dry resist film is then removed. In this case, if the through-hole conductor 32 projects from the core part 30, the projecting part is removed by polishing.

Subsequently, as described in Japanese Patent Laid-open Publication No. 2000-232078 (publication Date: Aug. 22, 2000), a plating head impregnated with a plating solution is brought into contact with an end face of the core. Pads 32t for measurement are then formed one by one using the through-hole conductor 32 as the cathode (step 4a or 4b). Ni/Au plating may be performed on the surface of each pad 32t.

In the cross-sectional view, a hollow part 34, the conductor 32, and the ferrite core 30 are concentrically disposed from the center (see X-X cross-sectional view). Regarding the results shown in FIGS. 5B to 5D, a microprobe of an impedance analyzer was brought into contact with the pads 32t for measurement to perform the measurement.

In FIGS. 5B to 5D, the inductors 30-2 of the comparative examples were prepared by the same method as that described above, i.e., with the same dimensions, with the same steps 1 to 4, and under the same conditions as those in the above method, except that FR-4 (a flame-retardant epoxy resin) was used instead of ferrite.

(Method of Embedding Inductor in Substrate)

Figure 7A:
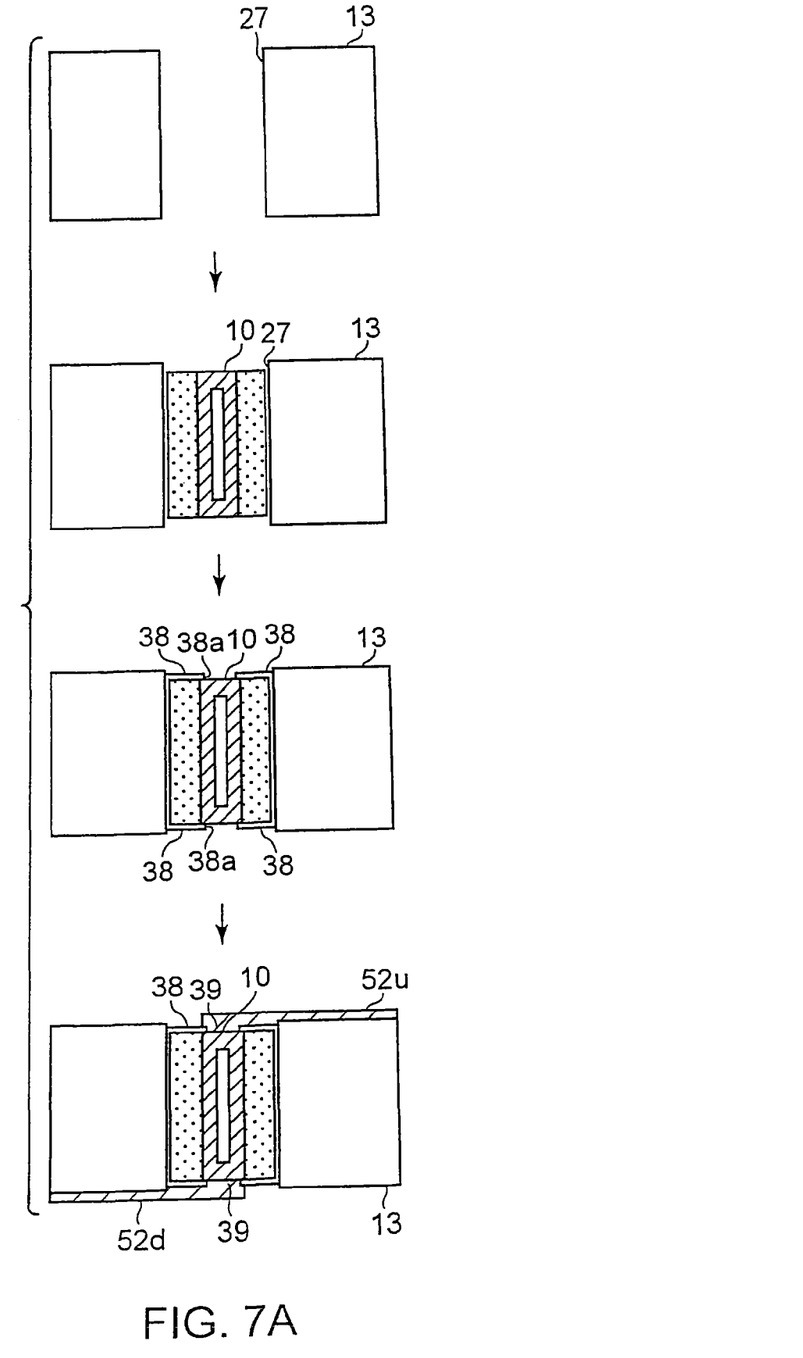
FIG. 7A includes views showing a method of embedding a produced inductor in a printed wiring board, according to an embodiment of the present invention.
Figure 7B:
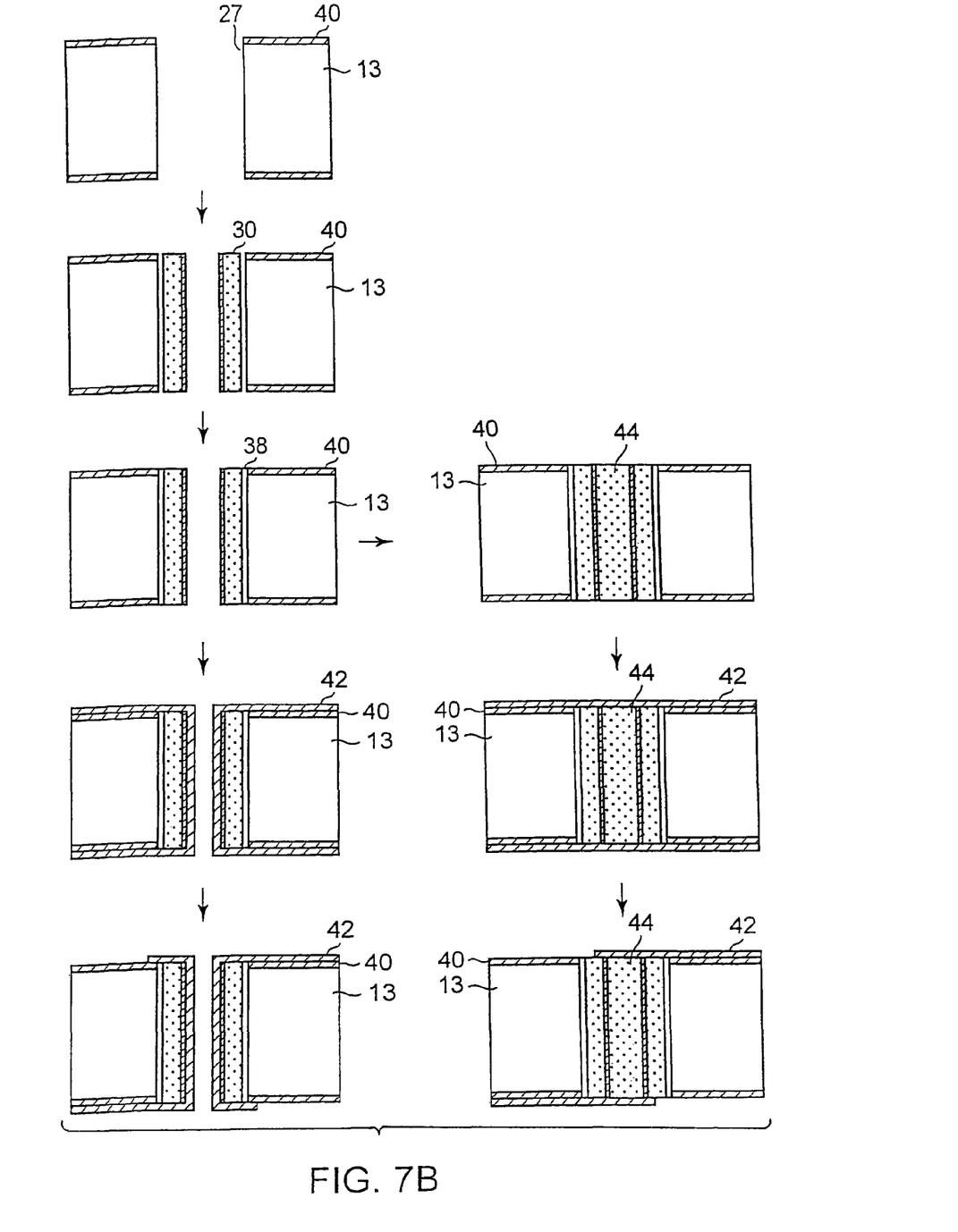
FIG. 7B includes views showing a method of embedding a produced inductor in a printed wiring board, according to another embodiment of the present invention.
Figure 7C:
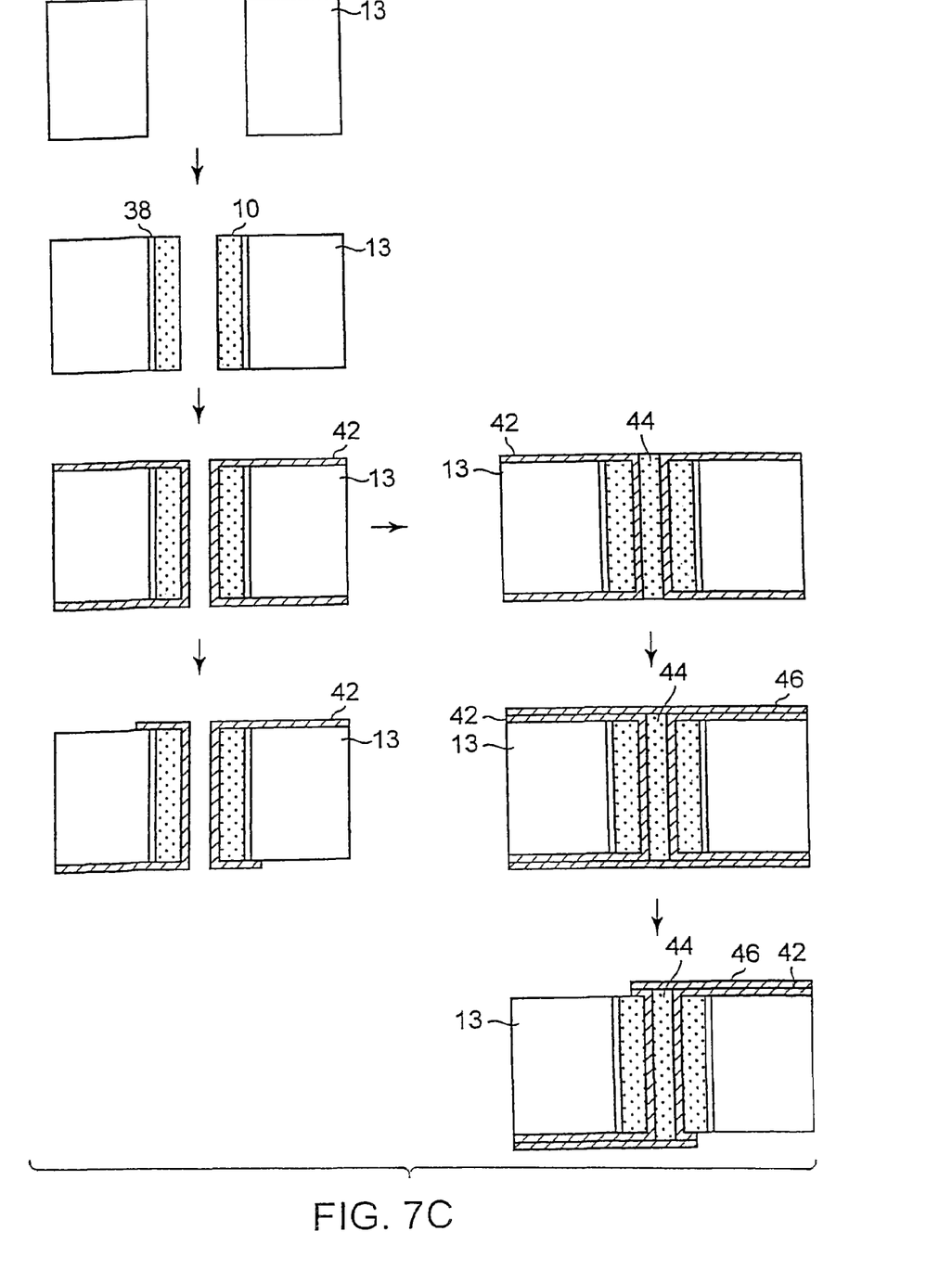
FIG. 7C includes views showing a method of embedding a produced inductor in a printed circuit board, according to another embodiment of the present invention.

FIGS. 7A to 7C include views showing methods of embedding a prepared inductor 10 in a core substrate 13. As described above, the inductor 10 may be embedded in a part of or throughout the entire package 2.

In a method of embedding an inductor shown in FIG. 7A, a through-hole 27 for embedding an inductor is formed in a core substrate 13 with, for example, a drill (step A-1). The inductor 10 prepared in steps 1 to 4a or 1 to 4b shown in FIG. 6 is inserted into the through-hole 27 (step A-2). A resin 38 is packed around the inductor 10. This resin 38 is preferably an under-fill resin having a low coefficient of thermal expansion (CTE), which is used in a flip-chip mounting. Subsequently, openings 38a are formed with a laser at the central parts of the resin 38 disposed on both end faces (step A-3). Filled via conductors 39 are formed by electroless copper plating and electrolytic copper plating, and the via conductors 39 are connected to surface conductor layers 52u and 52d of the package 2 (step A-4). Preferably, a solder resist layer may be covered as an insulating layer.

In a method of embedding an inductor shown in FIG. 7B, a hole is formed in a core substrate 13 clad with a copper foil 40 (step B-1), an inductor 10 is inserted into the hole (step B-2), a resin 38 is packed around the inductor (step B-3), electroless copper plating and electrolytic copper plating are performed to form a copper film 42 (step B-4a), and the copper film 42 is patterned (step B-5a). Alternatively, after step B-3, the opening of the inductor may be filled with a filling resin 44 (step B-4b), electroless copper plating and electrolytic copper plating may be performed to form a copper film 42 (step B-5b), and the copper film 42 may be patterned (step B-6b). The core substrate 13 may not include the copper foil 40.

A method of embedding an inductor shown in FIG. 7C is an example of a method in which a core substrate 13 not including a copper foil 40 is used, a core 30 of an inductor 10 is inserted into the substrate, and a conductor 32 is then formed. A hole is formed in the core substrate 13 (step C-1), cylindrical ferrite 30 formed in steps 1 and 2 shown in FIG. 6 is inserted into the hole, and a resin 38 is packed around the cylindrical ferrite 30 (step C-2), electroless copper plating and electrolytic copper plating are performed to form a copper film 42 (step C-3), and the copper film 42 is patterned (step C-4a). Alternatively, after step C-3, the opening of the inductor may be filled with a filling resin 44 (step C-4b), electroless copper plating and electrolytic copper plating may be performed to form a copper film 46 (step C-5b), and the copper films 42 and 46 may be patterned (step C-6b). The core substrate 13 may include a copper foil 40.

In the methods of embedding an inductor shown in FIGS. 7A to 7C, a resin substrate or a ceramic substrate may be also used as the substrate.

(Method of Producing Printed Wiring Board)

A method of producing a printed circuit board used as the package 2 and the motherboard 4 of the electronic device 1 shown in FIG. 1 will now be described with reference to FIGS. 8A to 8G. Known processes of manufacturing a multilayer printed wiring board include a through-hole plating process and new processes. Examples of the new processes include a process combining a plating process and a build-up process, a process combining a conductive paste application process and a build-up process, a process combining a build-up process and a transferring process, a transferring process, a process combining a columnar plating and a build-up process, and a collective laminating process. Furthermore, the combined plating build-up process is classified into a process using a copper foil with a resin, a process using a thermosetting resin, or a process using a photosensitive insulating resin, according to the material used and a method of forming a hole. Here, the method will be described according to the process using a thermosetting resin in the combined plating build-up process, which is often employed by the present inventors.

Figure 8A:
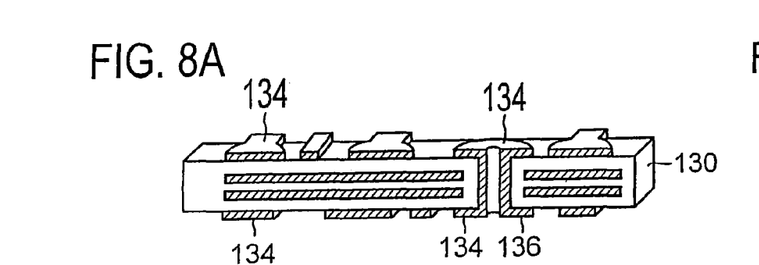
FIGS. 8A to 8G include views showing a method of manufacturing a printed wiring board used for the electronic device shown in FIG. 1.

As shown in FIG. 8A, a core substrate 130 is prepared. This core substrate 130 is manufactured by the through-hole plating process. An inner layer conductor pattern is formed on a glass-cloth epoxy-resin copper clad laminate or a glass-cloth high-heat-resistance-resin copper clad laminate. A desired number of these laminates are prepared, and are bonded with adhesive sheets known as prepreg to form a single sheet. A hole is formed through the sheet, and a plated film 136 is formed on the inner wall and the surface of the sheet by means of the through-hole plating process so as to connect inner conductor layers and outer conductor layers. A surface pattern 134 is then formed, thus producing the core substrate. Although this figure shows a multilayer core substrate that also includes a conductor circuit in the inner layer, the core substrate may be a double-sided core substrate in which a double-sided copper clad laminate is used as a starting material, no conductor circuit is provided in the inner layer, and the conductor circuits provided on the top face and the bottom face are connected via a through-hole conductor.

Figure 8B:
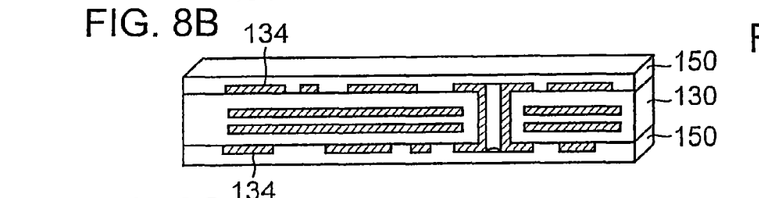

As shown in FIG. 8B, insulating layers 150 are formed both sides of the core substrate 130, respectively. Each of the insulating layers 150 is formed by coating a liquid or by a laminating method in which a film is heated and bonded with pressure under a vacuum.

Figure 8C:
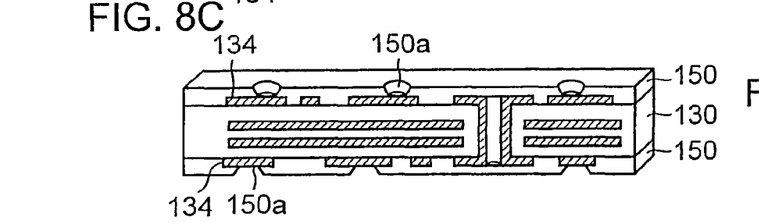

As shown in FIG. 8C, holes 150a are formed on the surfaces of the insulating layers 150, respectively.

Figure 8D:
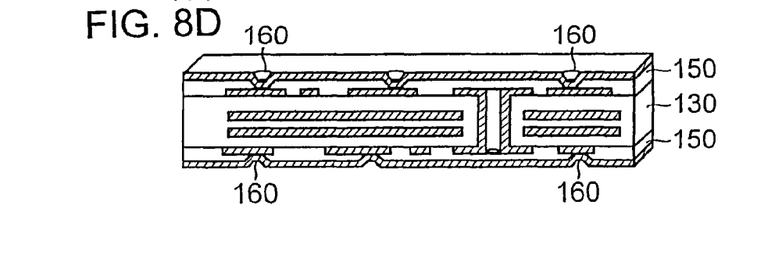

As shown in FIG. 8D, electroless copper plating and electrolytic copper plating are performed on the inner surface of the hole 150a and on the surface of the insulating layer 150 so as to be electrically connected with each other. In this step, in order to increase the adhesiveness of the plating, a treatment for roughening a surface is performed on the inner surface of the hole 150a and the surface of the insulating layer 150.

Figure 8E:
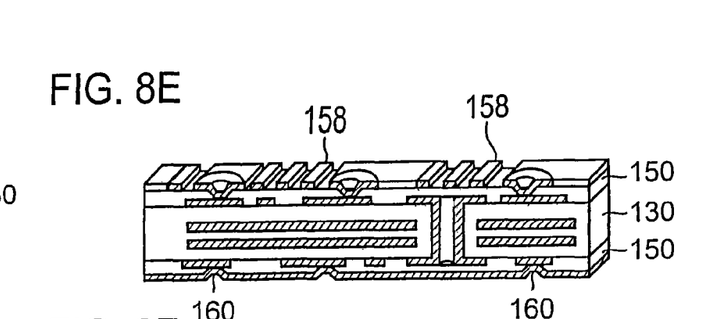

As shown in FIG. 8E, a conductor pattern 158 is formed on the upper surface as follows. Electrolytic copper plating is performed on the entire surface, that is, panel plating is performed to form a copper film 160. An etching resist is formed on the upper surface of the copper film. Subsequently, the conductor pattern 158 is formed by etching (subtractive process). Other methods such as the semi-additive process and the full-additive process may also be used.

Figure 8F:
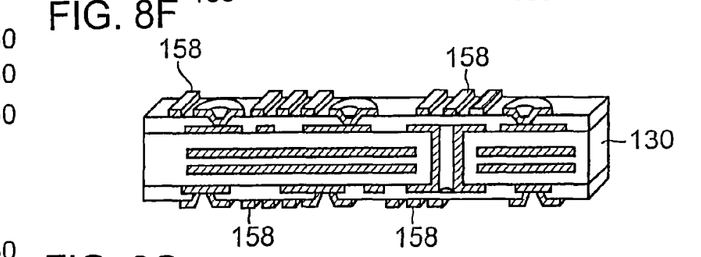

As shown in FIG. 8F, similarly, a conductor pattern 158 is formed on the lower surface. At this step, a layer of the conductor pattern is formed on each side of the core substrate. Then, the steps shown in FIG. 8B to FIG. 8F are repeated a desired number of times.

Figure 8G:
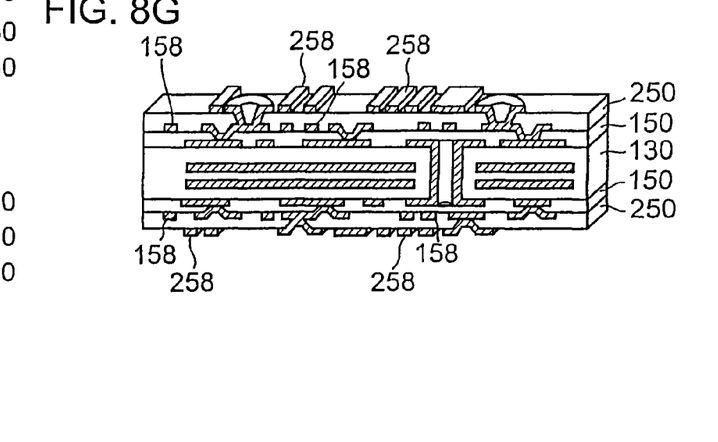

As shown in FIG. 8G, in this embodiment, the steps shown in FIG. 8B to FIG. 8F are repeated once to manufacture a multilayer printed wiring board. A solder resist layer (not shown) may be formed as an outermost layers according to need. Although it is not apparent from FIGS. 8A to 8G, conductor patterns 258 of the outermost layers are formed so as to match the patterns of the package 2 or the motherboard 4 shown in FIG. 1. An inductor is embedded in the completed package 2 by any one of the methods described in FIGS. 7A to 7C. The core substrate 130 shown in FIG. 8 or a printed wiring board prepared by alternately laminating an interlayer resin insulating layer and a conductor circuit on a core substrate corresponds to the substrate 13 shown in FIGS. 7A to 7C. In the step shown in FIG. 8C, a through-hole is formed so as to penetrate the insulating layer 150, the core substrate 130, and the insulating layer 150, and an inductor is embedded in the through-hole by any method shown in FIGS. 7A to 7C. Thus, the inductor can be installed in the core substrate and the interlayer resin insulating layers.

[Advantages and Effects]

The above embodiments have the following advantages and effects.

(Inductor)

(1) An inductor having a low DC resistance can be provided. The inductor includes a metal having a low resistivity, such as metallic copper, and has a length (about 1 mm) smaller than the thickness of a board. Accordingly, the DC resistance of the inductor is very low.

(2) An inductor having a high inductance can be provided. The inductor has a structure in which a conductor is in contact with a magnetic body with no gap therebetween, thereby increasing the inductance.

(3) An inductor having a small size can be provided. For example, the inductor has a radius of about 0.25 to 2 mm, and a length of about 1 mm. Thus, an inductor having a small size can be provided.

(4) An inductor that can be produced by the same manufacturing process as that of a printed circuit board can be provided. The process for producing the inductor includes forming a hole and plating. Thus, the inductor can be produced by the same manufacturing process as that of a printed wiring board.

(5) Because of its high inductance, the inductor can be used as a part of a power supply circuit through which a current of 0.1 A or more, preferably 1 A or more, flows.

(Inductor Embedded in Board)

(1) An inductor embedded in a board, which inductor requiring a mounting area on a printed circuit board that is considerably smaller than the mounting area of a surface mount device, can be provided. Since this inductor is embedded in the board, another surface mount device can be mounted over the inductor. Thus, the mounting area of the inductor is substantially equal to zero.

(2) The inductor can be disposed in the vicinity of a load. Since this inductor is embedded in the board, the inductor can be located even in an area where the load is mounted. For example, the inductor can be embedded in a position of a printed wiring board or a core substrate that is disposed directly under an IC.

(3) An inductor that can be embedded by the same manufacturing process as that of a printed wiring board can be provided. This inductor can be made in a printed wiring board by forming a hole, inserting the inductor, filling a resin, forming an opening, forming a via, and forming a conductor pattern. Thus, the inductor can be produced by the same manufacturing process as that of the printed circuit board.

(Electronic Device)

(1) An electronic device including a power supply circuit disposed in the vicinity of a load MPU can be provided. Since the distance from the output of the power supply circuit to the load MPU is very short, for example, 1 mm or less, the length of the conductor circuit used for the power supply is very short, and thus voltage variations due to a parasitic resistance or a parasitic inductance of wiring can be suppressed.

Figure 9:
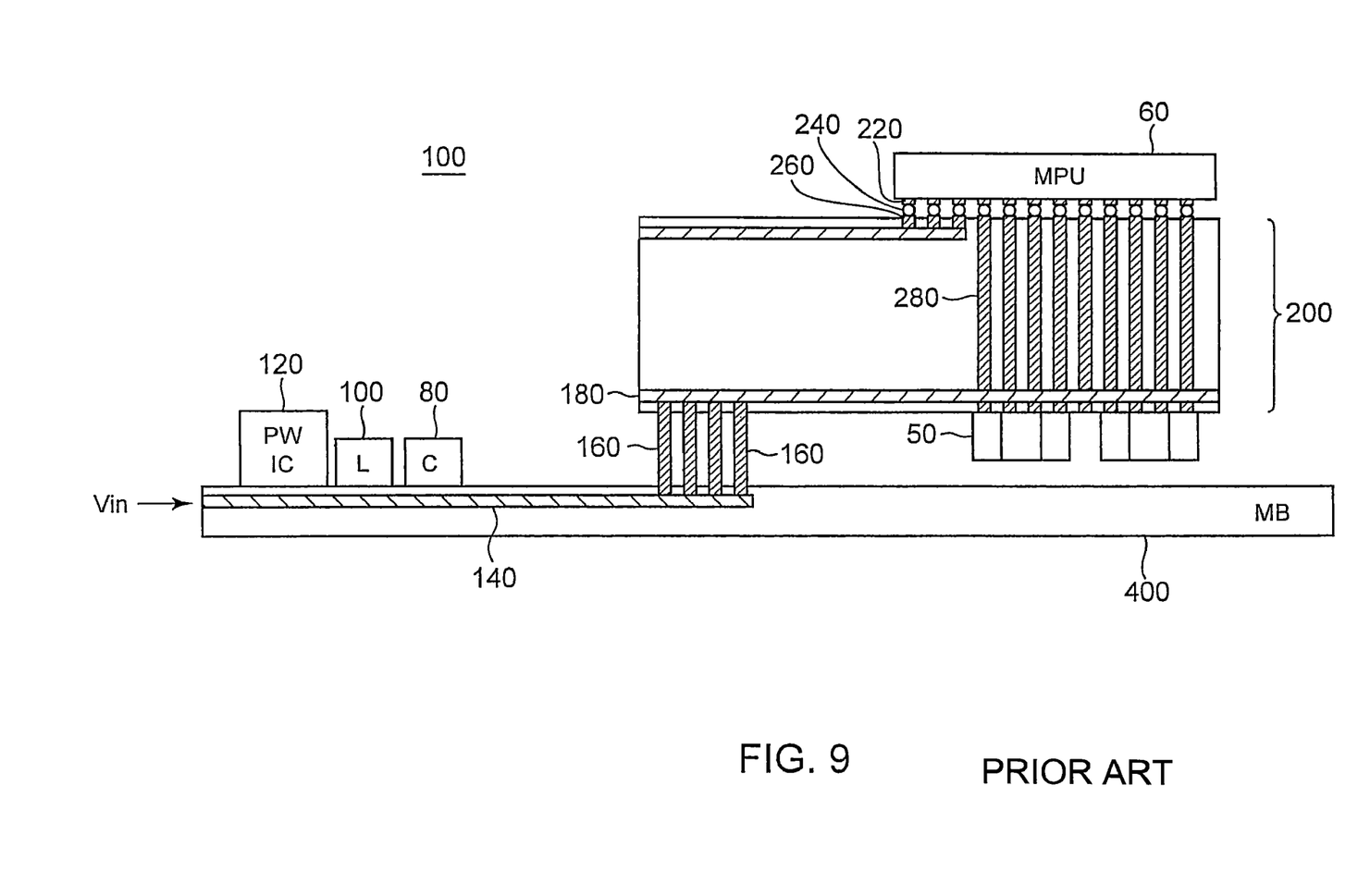
FIG. 9 is a view showing an existing printed circuit board constituting electronic device, on which a power supply circuit is mounted.

A specific example will now be described. FIG. 9 is a view showing an electronic device 100 including a printed circuit board on which an existing power supply circuit is mounted. The electronic device 100 includes a package (PK) 200 and a motherboard (MB) 400 having the package 200 thereon. The package 200 and the motherboard 400 are electrically connected to each other with, for example, pin junctions 160.

A power supply IC 120, an inductor element 100, and a capacitor element 80 that constitute the power supply circuit are surface mount type of discrete devices. Each of these devices requires a certain mounting area on the printed wiring board. Therefore, in this electronic device 100, these surface mount devices 120, 100, and 80 are mounted in the vicinity of an end of the power supply at an input voltage $V_{in}$ of the motherboard (MB) 400. The power is supplied from the power supply circuit to an MPU 60 through a conductor circuit 140 provided on the motherboard (MB) 400, the pin junctions 160, and conductor circuits (including a through-hole conductor and a via-hole conductor) 180 and 280 etc. that are provided on the package 200. In this electronic device 100, the distance from the output of the power supply circuit to the MPU 60, which is a load, is very long, for example, in the range of several centimeters to 10 cm. Since the length of the conductor circuit used for the power supply is very long, voltage variations due to a parasitic resistance or a parasitic inductance of wiring easily occur.

As compared with the known electronic device 100 shown in FIG. 9, in the electronic device 1 according to the embodiment shown in FIG. 1, it is apparent that the power supply circuit and the load MPU 6 are very close to each other.

MODIFICATIONS ETC

The embodiments of the inductor embedded in a board of the present invention and a power supply circuit including the inductor have been described. These embodiments are illustrative and do not limit the present invention. Accordingly, additions, variations, modifications, and the like of these embodiments that may easily occur to those skilled in the art should be considered within the scope of the present invention. The scope of the present invention is defined on the basis of the description of the appended claims.

What is claimed is:
1. An electronic device comprising:
a circuit board; and
a power supply circuit provided in the circuit board and configured to supply power to a semiconductor device mounted on a surface of the circuit board,
wherein the power supply circuit includes an inductor extending in a thickness direction of the circuit board perpendicular to the surface of the circuit board, the inductor comprises a magnetic body extending in the thickness direction of the circuit board and a through-hole conductor extending in the thickness direction of the circuit board, the magnetic body of the inductor has a through-hole extending in the thickness direction of the circuit board, and the through-hole conductor of the inductor is formed on an inner surface of the through-hole formed in the magnetic body.

2. The electronic device according to claim 1, wherein the power supply circuit includes a thin-film capacitor formed in a direction parallel to the surface of the circuit board, and a power supply IC device mounted on a surface of the circuit board on an opposite side of the surface on which the semiconductor device is mounted.

3. The electronic device according to claim 1, wherein the power supply circuit includes a thin-film capacitor formed in a direction parallel to the surface of the circuit board and a power supply IC device mounted on a surface of the circuit board on an opposite side of the surface on which the semiconductor device is mounted, and the power supply circuit and the semiconductor device are connected to each other with a conductive circuit having a distance of 1 mm or less.

4. The electronic device according to claim 1, wherein the power supply circuit is provided in a plurality in the circuit board.

5. The electronic device according to claim 1, wherein the circuit board has a core substrate, and the inductor is formed in the core substrate of the circuit board.

6. The electronic device according to claim 1, wherein the magnetic body has a cylindrical shape having the through-hole.

7. The electronic device according to claim 1, wherein the magnetic body has a cylindrical shape, the circuit board has a core substrate, and the magnetic body is embedded in the core substrate of the circuit board.

8. The electronic device according to claim 1, wherein the through-hole conductor is extending along a longitudinal axis of the magnetic body.

9. The electronic device according to claim 1, wherein the through-hole conductor is formed by plating.

10. The electronic device according to claim 1, wherein the through-hole conductor is formed by copper plating.

11. The electronic device according to claim 1, wherein the through-hole conductor is formed by plating.

12. The electronic device according to claim 1, wherein the power supply circuit and the semiconductor device are connected to each other with a conductive circuit comprising a plurality of via-hole conductors.

13. The electronic device according to claim 1, wherein the power supply circuit and the semiconductor device are connected to each other with a conductive circuit comprising a plurality of via-hole conductors in a distance of 1 mm or less.

* * * * *